United States Patent
Breitenstein et al.

(10) Patent No.: US 6,506,250 B1
(45) Date of Patent: Jan. 14, 2003

(54) METHOD FOR THE PRODUCTION OF MULTI-CRYSTALLINE SEMICONDUCTOR MATERIAL

(75) Inventors: Otwin Breitenstein, Langenbogen (DE); Dieter Franke, Vaals (NL)

(73) Assignees: Max-Planck Gesellschaft zur Forderung der Wissenschaften e.V., Munich (DE); Access e.V., Aachen (DE)

(*) Notice: Subject to any disclaimer, the term of this patent is extended or adjusted under 35 U.S.C. 154(b) by 0 days.

(21) Appl. No.: 09/856,140
(22) PCT Filed: Nov. 25, 1999
(86) PCT No.: PCT/DE99/03737
§ 371 (c)(1),
(2), (4) Date: May 30, 2001
(87) PCT Pub. No.: WO00/33366
PCT Pub. Date: Jun. 8, 2000

(30) Foreign Application Priority Data

Nov. 30, 1998 (DE) .......................................... 198 55 204

(51) Int. Cl.[7] .............................................. C30B 15/20
(52) U.S. Cl. .............................. 117/13; 117/14; 117/15
(58) Field of Search ................................ 117/13, 14, 15

(56) References Cited

FOREIGN PATENT DOCUMENTS

| DE | 3342496 | 6/1985 |
|---|---|---|
| EP | 0095756 | 12/1983 |
| JP | 3073519 | 3/1991 |
| JP | 4002685 | 1/1992 |

OTHER PUBLICATIONS

XP000542738 "Change of Minority Carrier Diffusion Length in Polycrystalline Silicon by Ultrasound Treatment", Ostapenko et al, Semiconductor Science and Technology, GB, Institute of Physics, London, vol. 10, No. 11, Jan. 11, 1995, pp. 1494–1500.

*Primary Examiner*—Felisa Hiteshew
(74) *Attorney, Agent, or Firm*—Dennison, Schultz & Dougherty

(57) ABSTRACT

A method for producing a multi-crystalline semiconductor material by crystallization from a melt of a base material in which vibration energy in the sonic or ultrasonic range is acoustically coupled by a gaseous transmission medium into the solidifying or cooling material during solidification of the melt and/or during subsequent further cooling. The parameters of this vibration energy are harmonized with the parameters of the melt and the cooling time in such a manner that the dislocation energy in the cooled multi-crystalline material is considerably lower than where there is no vibration energy coupling during the cooling time.

12 Claims, 1 Drawing Sheet

METHOD FOR THE PRODUCTION OF MULTI-CRYSTALLINE SEMICONDUCTOR MATERIAL

THIS APPLICATION IS A 371 OF PCT/DE99/03737/ Nov. 25, 1999.

BACKGROUND OF THE INVENTION

The invention relates to a method of producing multi-crystalline semiconductor material by crystallisation from a melt of a base material. A preferred but not exclusive field of application of the invention relates to the production of multi-crystalline silicon for photovoltaic purposes. The expression "multi-crystalline" is generally intended in this case to refer to the fact that it also comprises structures having relatively small grain sizes which are otherwise frequently described as "polycrystalline".

For the purpose of conserving energy in the future, energy sources are now being developed which convert solar rays into electrical energy by utilizing the photovoltaic effect. Low process costs in the processing of base materials to form semiconductor materials and high levels of photovoltaic efficiency have proven to be the key operating points for developing this technology further.

For photovoltaic applications, silicon is now preferably used which, as a starting material for solar cell production, can be divided into three groups: mono-crystalline generated crystals from Czochralski-installations; materials having a poly- or multi-crystalline structure from block crystallisation or foil drawing installations; thin layer material (generally consisting of Chemical Vapour Deposition). Owing to the comparatively lower process costs, the two first mentioned variations are frequently preferred, in which the crystallization is performed from a melt of a base material.

In the production of semiconductor materials by crystallization from a melt, phase-transition takes place together with cooling from high temperature ranges. Process conditions which can effect specific damage to the crystal structure are associated with these processes in dependence upon the process control and solidification rates and cooling rates. However, each type of disruption to an ideal crystal structure leads to a more or less considerable reduction in the electrical efficiency of the components, such as solar cells, which are manufactured from these materials.

It has been discovered that amongst the various crystal defects it is principally the density of crystal dislocations which contributes very substantially to the deterioration in electrical efficiency of semiconductor elements, in particular for limiting the efficiency of solar cells. Mono-crystalline drawn silicon, such as e.g. from Czochralski-installations, generally does not contain any dislocations of this kind; however, owing to the still relatively high production costs it is too expensive for the mass-production of solar cells. Multi-crystalline silicon, which can be produced from the melt in a shorter period of time, is a much more cost-effective option and is thus more readily available for the purpose of an extensive application. On the other hand, this material contains the said crystal dislocations, and the less favourable the cooling time during crystallisation, the greater the dislocation density.

Normally, after both phase-transition from the melt to the solid body and also during the subsequent cooling to room temperature, thermally induced stresses are produced in the material which in turn lead to a plastic deformation by the formation of crystal dislocations. The dislocations are extremely mobile close to the melting point, which is to be equated with a high degree of plasticity in the material. During further cooling, the rate at which these dislocations pass through the crystal decreases and specific dislocation structures are formed in dependence upon the process control. It is desired to reduce the dislocations but this could hitherto only be achieved by reducing the cooling rate, i.e. by prolonging the process time. This increases considerably the cost of the production process because the operational time of the production installation is a significant-cost factor.

Tests have shown that the crystal dislocations can be reduced significantly by virtue of mechanical action upon the melt during the phase-transition and/or also during the subsequent cooling to room temperature. More precisely, it has been found that the aforementioned conversion process from thermally induced macroscopic stresses to universal dislocation arrangements or dislocation arrangements which are distributed locally in the material volume can be influenced by coupling vibration energy in the sonic or ultrasonic range such that the total number of dislocations is reduced and in contrast other stress-relaxing mechanisms are favoured such as e.g. twin-formation. Experiments have demonstrated that these crystal twins contribute considerably less than dislocations to the reduction in electrical efficiency in particular in the case of solar cells.

SUMMARY OF THE INVENTION

In the case of the present invention, this knowledge is utilized for the purpose of achieving the object of obtaining a multi-crystalline semiconductor material by crystallization from a melt in such a manner that the ratio between process duration and dislocation density is more favourable than before. In order to achieve this, in accordance with the invention vibration energy is coupled in the sonic or ultrasonic range into the solidifying or cooling material during solidification of the melt and/or during the subsequent further cooling, wherein these parameters of this vibration energy coupling are harmonised with the parameters of the melt and the cooling time such that the dislocation density in the cooled multi-crystalline material is considerably lower than in the case where there is no vibration energy coupling during the respective cooling time. The term "cooling time" in this context is intended to refer to the total period of time from the commencement of the liquid/solid phase-transition up to complete cooling to room temperature.

Therefore, the invention achieves a considerable improvement in the hitherto conventional methods, in that it is possible either to reduce the dislocation density for a given process time or to shorten the process time with the dislocation density remaining unchanged or to achieve a more effective compromise between these two parameters than previously was the case.

Preferably, the frequency, intensity and the type of coupling of vibration energy are optimized in such a manner that the desired effect of a reduced dislocation density or a preferable formation of twins is achieved in the most effective manner possible. Alternatively, the method in accordance with the invention can also be applied in order to shorten the cooling time and thus the process time whilst accepting a less considerable reduction in the dislocation density, thus rendering the method more cost-effective.

The invention can be applied in the case of block crystallization methods and foil drawing methods. The vibration energy can be coupled-in via solid-borne sound or acoustically via a gaseous transmission medium such as e.g. air or a protective gas. In the latter case in particular, it is possible in one particular embodiment of the invention to perform the coupling-in process in a resonator-like manner, in that a standing acoustic wave is generated between a surface of the solidifying or cooling material and an acoustic reflector.

Tests to improve the electronic properties of silicon material by means of ultrasonic treatment are known per se (Appl. Phys. Lett. 68: 2873–2875). The influence of defects in crystalline semiconductor structures by means of ultrasound is also reported on in the Abstracts I10 and O43 in two contributions by S. Ostapenko and by I. V Ostrovskii inter alia at the conference "Polyse '98" (Schwäbisch Gmünd, 13.–18.9.1998). However, these tests were only carried out after actual crystal generation and at low temperatures up to 150° C. They also did not influence the crystal defects such as dislocations, but exclusively influenced the occurrence of point defects in the treated samples.

The process of influencing the production of crystalline semiconductor structures in situ by means of ultrasound is likewise known per se, and furthermore in conjunction with CVD-methods. In the Journal of Applied Physics 84: 306–310 there is a report on the treatment of polycrystalline CdS and CdSe by means of ultrasonic energy during deposition on a glass substrate and as a result of this treatment it was established that the charge carrier concentration was less and the stoichiometry and crystallinity of the deposited layers were improved. This is attributed to the reduction in point defects as a result of ultrasonic treatment.

The use of ultrasound during the process of drawing crystals from a melt is also known per se. The published abstract of a Japanese patent application, publication number JP4002685, describes a method of drawing Si-monocrystals from a melt, i.e. a Czochralski-method, wherein the pot containing the melt is continuously recharged with Si-particles. Since mono-crystals are already drawn without any dislocations, it is not possible in the case of this method for the ultrasonic coupling to influence the dislocation density. On the contrary, it is to be assumed that the ultrasound merely contributes to complete wetting of the recharged Si-particles and to production of a forced movement of the melt, so that the particles dissolve in the melt as rapidly as possible. In the case of a different technique which is disclosed in the abstract of a Japanese patent application under the publication number JP63011594 and which also relates to a Czochralski-method, ultrasound is coupled via the drawing rod into the growing single crystal for the sole purpose of detecting the echo reflected from the solid/liquid phase boundary and from this deriving information relating to the position and roughness of this boundary. This technique thus does not include the direct influence of ultrasound upon the crystal quality. In particular, the dislocation density cannot be affected, not even in passing, since this also refers to a mono-crystalline drawing process which is free of any dislocations.

Therefore, in the production of multi-crystalline semiconductor material from a melt, it has hitherto not been suggested to carry out ultrasonic treatment during the solidification and/or cooling procedure melts [sic], which would also be contrary to the hitherto prevailing principle of leaving the melt where possible undisturbed by external influences during these procedures.

Additional positive effects of the inventive coupling of vibration energy are to be expected in the case of various methods of producing semiconductors from the melt, in particular for silicon. In the case of methods of drawing foil from the melt with contact of the silicon on a substrate, it is possible to influence in a positive manner the adhesive conditions between silicon and the substrate by the application of sound and ultrasound. There is also a broad spectrum of applications of the method in accordance with the invention for other multi-crystalline semiconductor materials, such as e.g. multi-crystalline silicon-germanium or gallium arsenide, since crystal dislocations can also occur in this case owing to the different properties in the materials used. In all cases, it is necessary to take into consideration that the dislocation density is reduced by virtue of the influence of the vibration energy, whereby the crystal quality is improved.

For the purpose of illustrating the method in accordance with the invention, various embodiments are explained hereinunder, in part with reference to the drawings, in which

DESCRIPTION OF THE PREFERRED EMBODIMENTS

Figure 1:
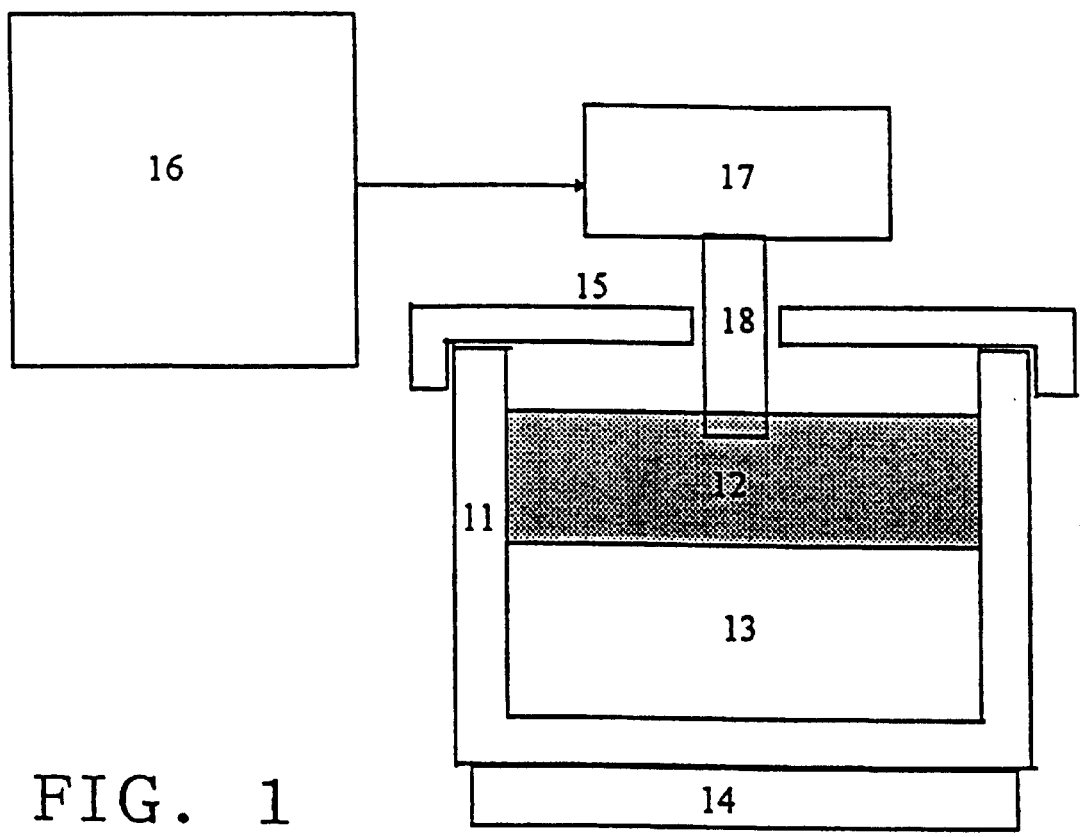
FIG. 1 shows, schematically in block form and partially in a sectional illustration, the implementation of the method in accordance with the invention in the case of a block casting method for multi-crystalline silicon.

In the case of the exemplified embodiment illustrated in FIG. 1, a pot 11 is illustrated in a vertical sectional view and can be of a conventional construction as also used in the case of standard block casting methods. The pot I1 is provided with an Si-melt 12 on the already crystallized Si-block 13, from which heat is withdrawn from below by means of a cooling device 14. The upperside of the pot 11 is covered with a thermal insulation 15 for the purpose of achieving the planar solidification. In addition to these conventional parts, an ultrasonic generator 16 having an ultrasonic converter 17 is provided in accordance with the invention, which couples an ultrasonic field into the Si-melt 12 via a sonotrode 18. In the simplest case, this ultrasonic field has a constant amplitude during the entire crystallization and cooling process. In order to optimize the method, the amplitude and also the frequency can be varied with respect to time, or the ultrasonic energy can also be coupled into the melt or into the growing block simultaneously or successively by way of ultrasonic converters which are placed at various points.

In one arrangement used for carrying out practical tests, the pot 11 was a graphite pot having a filling volume of about 5 ccm, and in which the thermal insulation 15 was omitted. The pot was filled Si-granular material and heated with the aid of a high-frequency induction heating device [not illustrated] to ca. 1450° C. until the weighed quantity melted. Then, a sonotrode 18 consisting of reaction-sintered SiC (pipe having an outer diameter of 15 mm, inner diameter of 8 mm and a length of 300 mm) was immersed approximately 5 mm into the melt and the melt together with the sonotrode was drawn at a rate of 1.14 cm/min downwards from the induction coil of the induction heating device. This produced a maximum cooling rate of 1.5° C./s. The sonotrode 18 was connected to the ultrasonic converter 17 which could be controlled by the ultrasonic generator 16. The devices which were used are the ultrasonic converter UW and the ultrasonic generator GM 200 which are associated with the SONOPLUS ultrasonic homogenizer HD 70 manufactured by the company Bandelin, Berlin, wherein with optimum acoustic adaption of the sonotrode the ultrasonic converter is able to output a maximum HF-line [sic] of 70 W at a frequency of 20 kHz. If the sonotrode 18 is not acoustically adapted in an optimum manner to the ultrasonic converter 17, the output electrical HF-output was only 10% of the maximum output, i.e. ca. 7 W, according to the ultrasonic generator display.

Two tests were carried out under identical conditions, wherein only in one of these tests was the ultrasonic generator switched on for the entire solidification time until the pot temperature fell to 400° C. The two silicon melts comprising the sonotrode melted therein were cut open vertically in the middle using a diamond saw, were polished and structurally etched with a secco-etching solution. The crystallite size in both cases was several millimetres. In the sample which was crystallized by the effect of ultrasound, the crystals were somewhat smaller and there was a larger number of straight twin grain boundaries. With respect to both samples, the dislocation density was determined by means of an automated image processing process. For the sample which was crystallized without the effect of ultrasound, a value of $2\times10^6$ was achieved in satisfactory regions and a value greater than $10^7$ dislocations/cm$^2$ was achieved in less satisfactory regions. For the sample which was crystallized by the effect of ultrasound, a value of $10^5$ was achieved in satisfactory regions and a value of $8\times10^5$ dislocations/cm$^2$ was achieved in less satisfactory regions. The values from the two tests differ significantly from each other, which means that the reduction in the dislocation density by means of crystallization under the effect of ultrasound can be considered to be proven experimentally.

Figure 2:
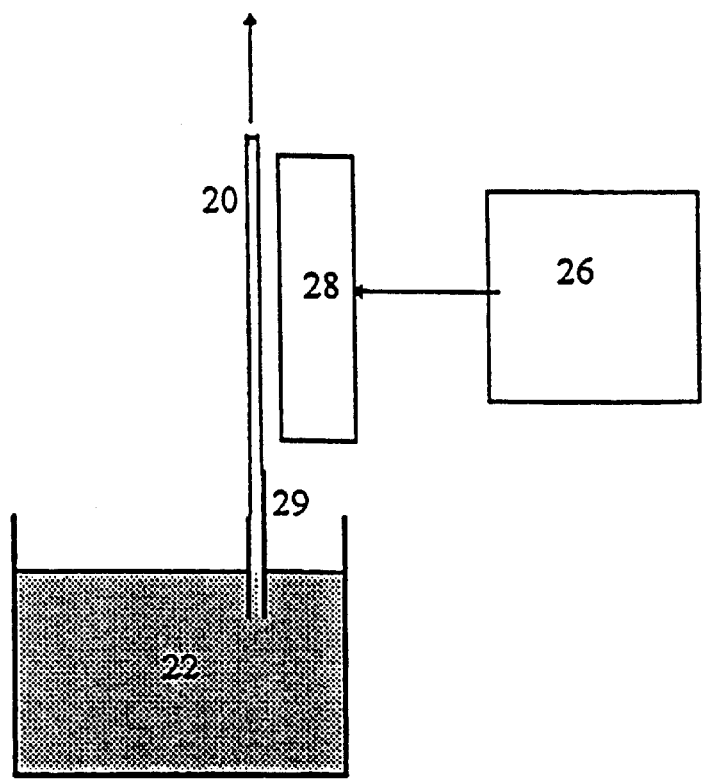
FIG. 2 shows, likewise in a block illustration and partially in a sectional view, the implementation of the method in accordance with the invention for drawing a self-supporting silicon foil from a melt.

In the case of one embodiment of the method in accordance with the invention as shown in FIG. 2, an Si-foil 20 is drawn out upwardly from the melt 22 from a nozzle 29 in a self-supporting manner. The ultrasonic converter 28 which is controlled by the ultrasonic generator 26 is arranged in this case as an acoustic flat-top antenna directly opposite the cooling Si-foil 20, so that the ultrasonic energy is coupled in this case into the foil 20 via the ambient air or a protective gas. Within the foil, the ultrasound is propagated as solid-borne sound up to the solid/liquid phase boundary surface. In this case, it is also possible to optimize the method by means of suitably controlling or arranging the ultrasonic converter(s). If the cooling Si-foil is not self-supporting as is the case in FIG. 2, but rests or slides on a solid base, then the energy can also be coupled as solid-borne sound via this base. The embodiments described above with reference to FIGS. 1 and 2 are merely examples. Naturally it is possible to provide numerous modifications within the scope of the invention. For example, in the case of the block crystallization method the vibration energy can also be coupled in by way of the body of the melting pot. In order to increase the effectiveness of the vibration energy coupling, it is possible, in one particular embodiment of the invention, to create a type of resonator, in that between a surface of the material, where the energy is to be coupled-in, and an acoustic reflector arrangement there is formed a resonance space which is filled with air or a protective gas and whose acoustic resonance frequency is tailored to suit the frequency of the vibration energy. For example, in the case of the variation of the method illustrated in FIG. 2, the flat-top antenna 28 itself can be used for this purpose as a reflector and is then to be arranged at such a spacing from the Si-foil 20 that a standing acoustic wave is formed in the intermediate space. In the case of a block crystallization method, it is possible to take a corresponding approach, e.g. in that the space between the surface of the material, which is located in the melting pot, and the overlying thermal insulation or a closed cover is dimensioned and used as a resonance space. For example, the sonotrode 18 which is illustrated in FIG. 1 can be replaced by a flat-top antenna which is excited by the ultrasonic converter 17 and which is integrated in the insulating cover 15. The underside of the cover then acts as an acoustic reflector which delimits the resonance space.

On the whole, it has been shown that fewer dislocations occur in each case by means of the effect of ultrasound. It is possible to optimize the parameters of the ultrasonic treatment (frequency and in particular amplitude of the coupled-in ultrasonic field) in dependence upon external process conditions by means of respective tests, wherein the minimum dislocation density which can be considered as a measurement of the internal distortions which have grown-in represents the criterion for optimization. The vibration frequency which is to be preferably used lies in the range of 10 to 25 kHz. The amplitude of the coupled-in vibrations lies preferably in the range of 0.1 to 10 micrometers.

What is claimed is:

1. A method of producing a multi-crystalline semiconductor material by crystallization from a melt of a base material, comprising, during solidification of the melt, during subsequent further cooling or during both solidification and further cooling, acoustically coupling vibration energy in the sonic or ultrasonic range via a gaseous transmission medium into the solidifying or cooling material, wherein parameters of the vibration energy coupling are harmonized with parameters of the melt and cooling time in such a manner that dislocation density in the cooled multi-crystalline material is considerably lower than where there is no vibration energy coupling during a respective cooling time.

2. Method according to claim 1, wherein the gaseous transmission medium is air or a protective gas.

3. Method according to claim 1 wherein the vibration energy is coupled in an acoustic manner with aided by an acoustic resonator which is excited to oscillation, and wherein between a surface of the solidifying or cooling material and an acoustic reflector arrangement there is formed a resonance space which is filled with the gaseous transmission medium and having a resonance frequency tailored to suit the frequency of the vibration energy.

4. Method according to claim 1, wherein the coupled-in vibration energy has an amplitude which lies in the range of 0.1 to 10 micrometers.

5. Method according to any one of the claims 1 to 4, characterised in that the vibration energy is coupled acoustically into the material by way of a gaseous medium.

6. Method according to claim 5, characterised in that the gaseous transmission medium is air or a protective gas.

7. Method according to claim 5 or 6, characterised in that the vibration energy is coupled in an acoustic manner with the aid of an acoustic resonator which is excited to oscillation, in that between a surface of the solidifying or cooling material and an acoustic reflector arrangement there is formed a resonance space which is filled with the gaseous transmission medium and whose resonance frequency is tailored to suit the frequency of the vibration energy.

8. Method according to claim 1, wherein the coupled-in vibration energy has a frequency which lies in the range of 10 to 25 kHz.

9. Method according to claim 1, wherein the base material is a silicon material which is designed for photovoltaic applications.

10. Method according to claim 1, wherein the vibration energy is coupled into the liquid melt during solidification thereof.

11. Method according to claim 1, for production of a semiconductor body by drawing the semiconductor material from the melt, wherein the vibration energy is coupled during the drawing into the cooling material which is drawn from the melt.

12. Method according to claim 11, characterised in that the vibration energy is coupled in as solid-borne sound via a base, on which the material drawn from the melt rests or slides.

* * * * *